(12) United States Patent
Beck

(10) Patent No.: US 7,746,151 B2
(45) Date of Patent: Jun. 29, 2010

(54) VARIABLE GAIN MIXER

(75) Inventor: Sung Ho Beck, Seongnam-si (KR)

(73) Assignee: FCI Inc. (KR)

( * ) Notice: Subject to any disclaimer, the term of this patent is extended or adjusted under 35 U.S.C. 154(b) by 203 days.

(21) Appl. No.: 11/993,001

(22) PCT Filed: Jun. 30, 2006

(86) PCT No.: PCT/KR2006/002555

§ 371 (c)(1),
(2), (4) Date: Dec. 18, 2007

(87) PCT Pub. No.: WO2007/004816

PCT Pub. Date: Jan. 11, 2007

(65) Prior Publication Data

US 2008/0315953 A1     Dec. 25, 2008

(30) Foreign Application Priority Data

Jul. 1, 2005     (KR) ............... 10-2005-0059021

(51) Int. Cl.
*G06G 7/44* (2006.01)
(52) U.S. Cl. .................... 327/359; 327/356
(58) Field of Classification Search ......... 327/355–361; 455/326
See application file for complete search history.

(56) References Cited

U.S. PATENT DOCUMENTS

| | | | |
|---|---|---|---|
| 6,212,369 B1* | 4/2001 | Avasarala | 455/333 |
| 6,342,804 B1* | 1/2002 | Havens et al. | 327/357 |
| 6,404,263 B1* | 6/2002 | Wang | 327/359 |
| 6,438,365 B1* | 8/2002 | Balteanu | 455/326 |
| 6,812,771 B1* | 11/2004 | Behel et al. | 327/359 |
| 6,931,083 B1 | 8/2005 | Linder et al. | |
| 7,521,997 B2* | 4/2009 | Beck et al. | 330/254 |

FOREIGN PATENT DOCUMENTS

| | | |
|---|---|---|
| KR | 1999-024433 | 4/1999 |
| KR | 2002-0026354 | 4/2002 |

OTHER PUBLICATIONS

Abdellatif Bellaouar et al., "A Highly-Integrated SiGe BiCMOS WCDMA Transmitter IC", International Solid-State Circuits and Systems, 2002.
International Search Report for PCT/KR2006/002555 mailed Oct. 30, 2006.
Written Opinion for PCT/KR2006/002555 mailed Oct. 30, 2006.

* cited by examiner

*Primary Examiner*—Hai L Nguyen
(74) *Attorney, Agent, or Firm*—Jae Y. Park; Kile Goekjian Reed & McManus

(57) ABSTRACT

The mixer includes mixers constructed with variable gain amplifiers having two transistor pairs Qp+/Qp– and Qn+/Qn– to have a predetermined gain by using LO+ and LO– signals; and LO bias circuits connected to have bias voltages different from each other with respect to the LO+ and LO– signals of the mixers and share an input signal.

2 Claims, 2 Drawing Sheets

Prior Art [Fig. 1]
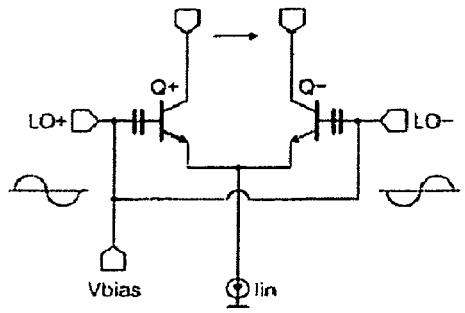
Prior Art [Fig. 2]
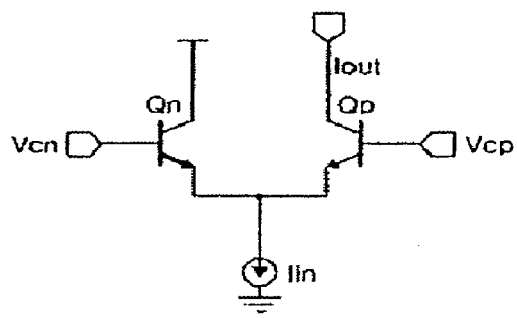
[Fig. 3]
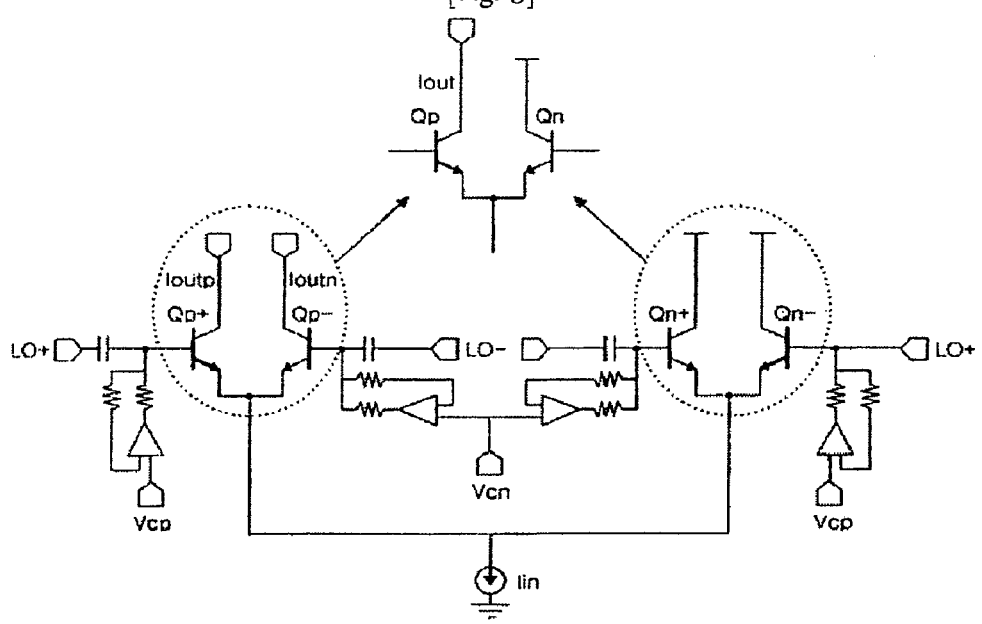
[Fig. 4]
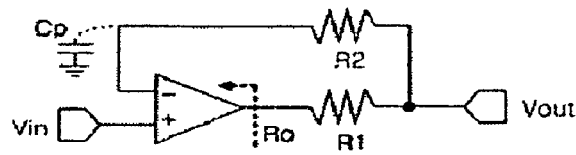

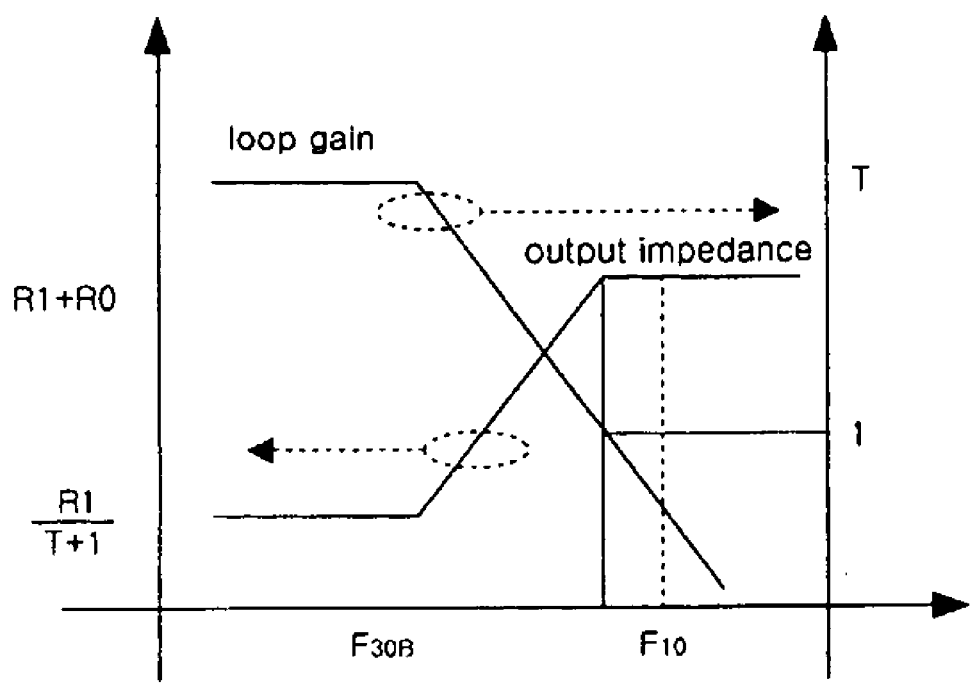
[Fig. 5]

VARIABLE GAIN MIXER

TECHNICAL FIELD

The present invention relates to a frequency mixer, and more particularly, to a variable gain mixer capable of controlling a gain at a low source voltage in a wide range without additional current consumption.

BACKGROUND ART

FIG. 1 shows a conventional Gilbert type active mixer.

Equation 1 expresses an operation of the active mixer.

$$\frac{I_{out}}{I_{in}} = \frac{1}{\pi}\{\cos(\omega_{in}+\omega_{LO})t + \cos(\omega_{in}-\omega_{LO})t\} \quad \text{[Equation 1]}$$

An output signal $I_{out}$ is converted to have a required frequency for $\omega_{in}+\omega_{LO}$ or $\omega_{in}-\omega_{LO}$ by switching operations of transistors Q+ and Q−.

The mixing operations are not influenced by a bias voltage Vbias. The bias voltage Vbias is used to determine an operating point to allow the transistors Q+ and Q− to operate properly.

FIG. 2 shows an embodiment of a conventional current steering variable gain amplifier.

An input signal $I_{in}$ is steered by an output through a transistor Qp or a supply through a transistor Qn and controlled by a voltage Vc.

A current gain is determined by Equation 2. in below $$\frac{I_{out}}{I_{in}} = \frac{1}{1+\exp\left(-\frac{V_c}{V_T}\right)}, \quad V_T = \frac{kT}{q} \quad \text{[Equation 2]}$$

In general, in order to guarantee a dB linearity of the voltage Vc, dependence on process, temperature, and pre-distortion has to be removed. Circuits for removing the dependence on process, temperature, and pre-distortion have been widely proposed (see: "A highly-Integrated SiGe BiCMOS WCDMA Transmitter IC", by Abdellatif Bellaouar, Michel Frechette, Ahmed R. Fridi, Sherif H. K. Embabi, International Solid-State Circuits and Systems, 2002, 14.5).

DETAILED DESCRIPTION OF THE INVENTION

Technical Goal of the Invention

In order to solve the aforementioned problems, an object of the present invention is to provide a variable gain mixer capable of controlling a gain at a low source voltage in a wide range without additional current consumption.

DISCLOSURE OF THE INVENTION

According to an aspect of the present invention, there is provided a variable gain mixer includes: mixers constructed with variable gain amplifiers having two transistor pairs Qp+/Qp− and Qn+/Qn− to have a predetermined gain by using LO+ and LO− signals; and LO bias circuits connected to have bias voltages different from each other with respect to the LO+ and LO− signals of the mixers and share an input signal.

BRIEF DESCRIPTION OF THE DRAWINGS

The above and other features and advantages of the present invention will become more apparent by describing in detail exemplary embodiments thereof with reference to the attached drawings in which:

FIG. 1 shows a conventional Gilbert type active mixer;

FIG. 2 shows an embodiment of a conventional current steering variable gain amplifier;

FIG. 3 shows a variable gain mixer according to the present invention;

FIG. 4 shows a local oscillator (LO) bias circuit; and

FIG. 5 is a graph showing a change in impedance of a LO bias circuit.

BEST MODE FOR CARRYING OUT THE INVENTION

Hereinafter, the present will be described in detail with reference to accompanying drawings.

FIG. 3 shows a variable gain mixer according to the present invention.

Two Gilbert mixers have bias voltages different from each other with respect to a local oscillator (LO) signal and are connected to share an input signal.

Two transistor pairs Qp+/Qp− and Qn+/Qn− constitute active mixers, respectively, as shown in FIG. 1.

Two transistor pairs Qp+/Qn+ and Qp−/Qn− constitute current steering variable gain amplifiers CS-VGA, respectively, as shown in FIG. 2.

The input signal is steered by a base bias voltage difference Vc (=Vcp−Vcn). A sum of currents passing though between the transistors Qp+ and Qp− determines a current gain of the variable gain mixer (VGM). Thereafter, the signal is mixed with the local oscillator LO to perform a frequency translation.

In order to obtain a linear-in-DB characteristic, the LO signal have to be applied to both Qn+− and Qp+−. The LO signal is large enough to change an operating condition of LO switching transistors. Therefore, if the LO signal is not applied to the transistors Qn+ and Qn−, the Qn+ and Qn− will be turn on or off consequently. As a result, the current gain is highly dependent on a LO amplitude.

Since the LO signal is applied to the transistors Qn+ and Qn−, although the LO signal level is high, a predetermined base voltage difference is maintained, and the variable gain mixer VGM is independent on the LO signal level. However, a special technique is required for applying the LO bias voltage. If a resistance is used to reduce a load of the LO signal as in a conventional method, a voltage difference for a gain control signal decreases due to a base current of the pre-used resistance and the transistors. Therefore, the linear-in-dB characteristic deteriorates. Therefore, in order to prevent the damage, a special bias circuit as shown in FIG. 4 is needed.

FIG. 4 shows the LO bias circuit.

The LO bias circuit is constructed with an operation amplifier (op-amp), a first resistance R1 connected to an output of the op-amp, and a second resistance R2 connected between an output of the first resistance R1 and an input of the op-amp.

The second resistance R2 is connected to remove a capacitive load to the input of the op-amp.

In a serial connection, a feedback loop gain is high, and an output resistance shown in Vout is very low as described in Equation 3.

$$R_{out} = \frac{R_1 + R_0}{1 + T}, \quad T: \text{loop gain} \qquad \text{[Equation 3]}$$

Consequently, since the voltage drop at DC is close to 0, the linearity in dB characteristic for variable gain amplifier VGA is maintained FIG. 5 is a graph showing a change in impedance of the LO bias circuit.

In LO frequency, the feedback loop; gain is less than 1, and the output resistance becomes R1+R0 (here, the R0 is an output resistance of the op-amp itself).

As a result, the load to a LO block is very small. The R2 is added to remove the capacitive load to the output of the op-amp.

While the present invention has been particularly shown and described with reference to exemplary embodiments thereof, it will be understood by those skilled in the art that various changes in form and details may be made therein without departing from the spirit and scope of the present invention as defined by the appended claims.

INDUSTRIAL APPLICABILITY

Accordingly, the present invention has advantages in that, by integrating the variable gain amplifiers into the mixers, the gain change can be obtained at a low source voltage in a wide range without connecting a number of variable gain amplifiers.

In addition, by simultaneously applying the LO signal and a gain change signal to the variable gain mixer having only two gains, the gain change can have the linearity in dB characteristic.

The invention claimed is:

1. A variable gain mixer comprising:
    mixers constructed with variable gain amplifiers having two transistor pairs Qp+/Qp− and Qn+/Qn− to have a predetermined gain by using LO+ and LO− signals; and
    LO bias circuits connected to have bias voltages different from each other with respect to the LO+ and LO− signals of the mixers and share an input signal,
    wherein the LO bias circuit is constructed with an operation amplifier, a first resistance connected to an output of the operation amplifier, and a second resistance connected between an output of the first resistance and an input of the operation amplifier to remove a capacitive load to the input of the operation amplifier.

2. The mixer according to claim 1, wherein the LO bias circuits have bias voltages different from other with respect to the LO signals.

* * * * *